United States Patent [19]

Takizawa et al.

[11] Patent Number: 5,615,077
[45] Date of Patent: Mar. 25, 1997

[54] ACTIVE TERMINATOR THE THERMAL SHUTDOWN STATE OF WHICH CAN BE DETECTED

[75] Inventors: Noboru Takizawa; Jun Iida, both of Kyoto, Japan

[73] Assignee: Rohm Co., Ltd., Kyoto, Japan

[21] Appl. No.: 491,705

[22] Filed: Jun. 19, 1995

[30] Foreign Application Priority Data

Jun. 17, 1994 [JP] Japan .................................... 6-136162

[51] Int. Cl.⁶ ...................................................... H02H 5/04
[52] U.S. Cl. ............................................ 361/103; 361/115
[58] Field of Search ................................ 361/103, 115; 340/584

[56] References Cited

U.S. PATENT DOCUMENTS 5,115,225  5/1992  Dao et al. ................................ 340/584

*Primary Examiner*—Jeffrey A. Gaffin
*Assistant Examiner*—Stephen Jackson
*Attorney, Agent, or Firm*—Fish & Richardson, P.C.

[57] ABSTRACT

An active terminator comprises a thermal shutdown circuit. When this circuit detects a predetermined high temperature, this information is supplied to a driver, and the active terminator stops operating. The signal from the thermal shutdown circuit is also supplied to an RS latch circuit that stores information to the effect that the thermal shutdown circuit has detected high temperature, and that the active terminator has stopped operation. A computer examines the contents of this RS latch circuit so that it can be determined that the terminator has stopped operating, and communication errors can therefore be prevented by, for example, reducing the data transfer rate accordingly.

6 Claims, 2 Drawing Sheets

ACTIVE TERMINATOR THE THERMAL SHUTDOWN STATE OF WHICH CAN BE DETECTED

DETAILED DESCRIPTION OF THE INVENTION

1. Field of the Invention

This invention relates to an active terminator installed at the end of a communications bus that controls the electrical potential of the bus, and in particular to the processing performed by the terminator at high temperature.

2. Background of the Invention

A SCSI (Small Computer System Interface) has conventionally been used to control connections of computers to peripheral instruments. This SCSI is a standard parallel interface, and is widely used for example to connect a host computer to a hard disk.

An active terminator is installed at the end of the SCSI bus. This terminator raises the electrical potential of the bus so as to permit its high speed operation.

The terminator may supply a predetermined amount of power to a plurality of buses, and when the amount of power consumed is relatively high, overheating may occur. In a conventional terminator, the high temperature is detected by a thermistor or the like, and operation is shut down automatically at high temperature so as to prevent damage to the equipment. When the temperature falls, operation re-starts automatically (recovery).

However, if the active terminator stops operating due to high temperature, the bus potential becomes unstable, and in particular it can no longer be rapidly varied. Consequently in devices that perform communications using an SCSI bus, communication errors tend to occur frequently. When a communication error occurs, the system re-sends the data, and if the error recurs, predetermined processing is performed such as changing the communications speed so as to maintain the communications.

When such a communication error occurs, the system recognizes only that an error occurred when the data was transferred via the bus, and cannot easily determine whether or not the terminator has stopped operation. Further, as operation recovers when the temperature falls again, it is difficult to pinpoint the cause of the error.

SUMMARY OF THE INVENTION

It is therefore an object of the invention to provide an active terminator whereof operation shutdown at high temperature can easily be recognized.

According to this invention, when the active terminator stops operating due to high temperature, this event is stored in a memory. By examining the contents of this memory, therefore, the host computer may verify that the terminator has stopped operating, and the data transmission rate may then be set low so as to prevent communication errors from occurring. Further, even if a communication error does occur, error processing can be performed on the assumption that the terminator has stopped operating, and system reliability is therefore increased.

DETAILED DESCRIPTION OF THE PREFERRED EMBODIMENTS

Figure 1:
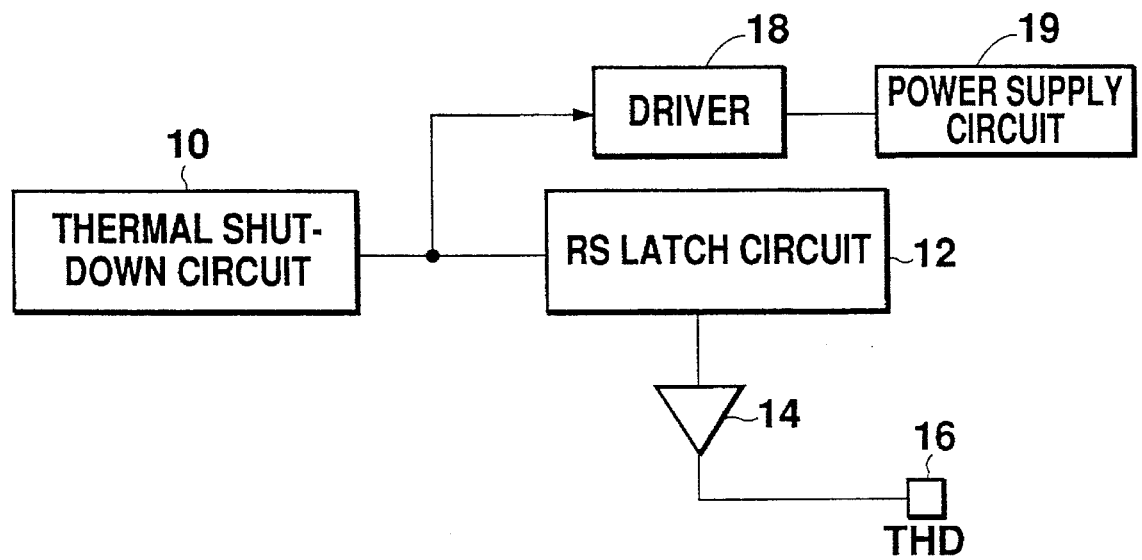
FIG. 1 is a block diagram showing the construction of one embodiment of the invention.
Figure 2:
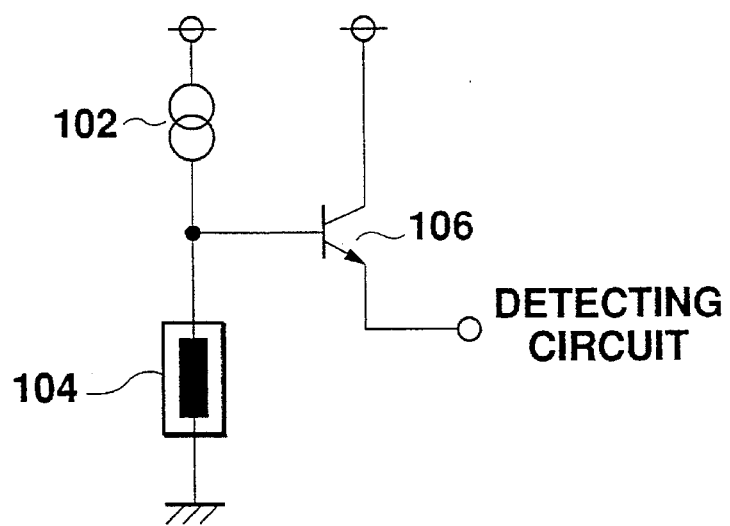
FIG. 2 is a diagram showing the construction of a temperature detecting circuit.

One embodiment of this invention will now be described with reference to the drawings. FIG. 1 is a block diagram showing the overall construction of the embodiment. A thermal shutdown circuit 10 comprises, for example, a fixed current supply 102 and a thermistor 104 connected in series between the power supply and earth as shown in FIG. 2. The resistance value of the thermistor 104 varies according to the temperature, and a voltage is obtained at the contact point of the fixed current supply 102 and thermistor 104. A transistor 106 is switched on and off by this voltage so as to output a detection signal. The circuit 10 therefore outputs a high temperature detection signal when the temperature of the active terminator is at or above a predetermined level. This signal from the circuit 10 is supplied to a driver 18. The driver 18 comprises transistors or the like that switch a terminator power supply circuit 19 on and off. The terminator power supply 19 is therefore switched on and off via the transistors in the driver 18 by means of the detection signal from the circuit 10. Also, according to this embodiment, the active terminator is set so that the highest temperature at which it can operate is approximately 205° C., and so that the circuit 10 operates at approximately 170° C. to within ±35° C.

According to this embodiment, the output of the circuit 10 is supplied to a latch circuit 12. This latch circuit 12 receives the output of the circuit 10 and stores any variation in it. When the circuit 10 has detected a high temperature of the terminator, a value indicating this (e.g. [H]) is set by the circuit 12. The output of this circuit 12 is led to a THD terminal 16 via a buffer amplifier 14, hence by observing the state of the terminal 16, it can be determined whether or not the terminator is in a thermal shutdown state.

When it is detected that the temperature has sufficiently fallen due to the thermal shutdown circuit 10, this signal is supplied to the driver 18, and the terminator resumes operation. A reset signal is then supplied to the RS latch so that the RS latch circuit 12 is reset. For example, it can be arranged that an H Level is supplied when the output of the terminator driver 18 has been restored by the RS latch reset terminal. Hence, by observing the state of the THD terminal 16, it can easily be determined from outside whether or not the terminator has stopped operating.

Figure 3:
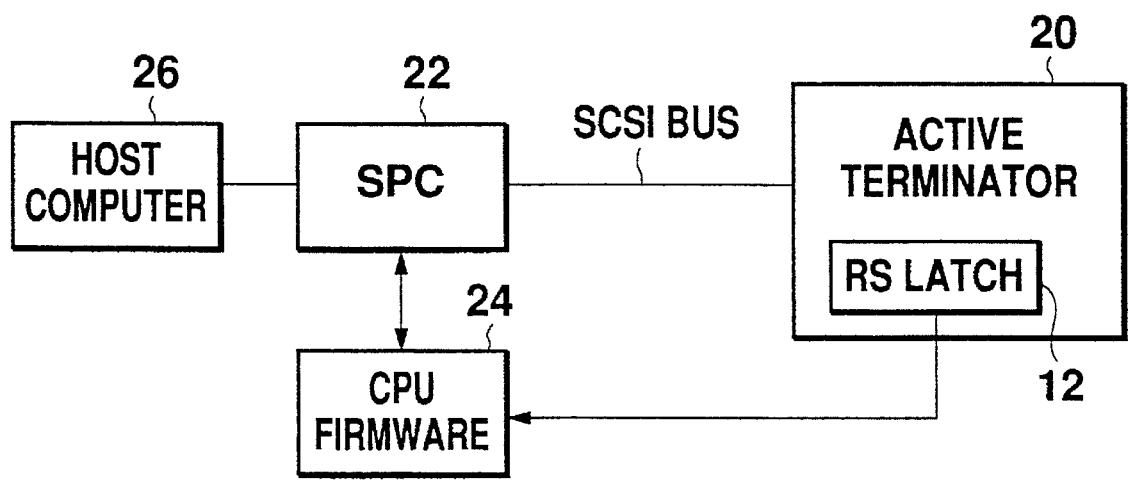
FIG. 3 is a block diagram showing the construction of a whole system.

FIG. 3 shows the construction of a system comprising an active terminator 20. An SPC (SCSI protocol controller) 22 is connected to a SCSI bus at the opposite end to that at which the active terminator 20 is installed. The SPC 22 controls data transfer that takes place using the SCSI bus. CPU firmware 24 is also connected to the SPC 22, this CPU firmware 24 handling predetermined processing required for data transfer in the SCSI.

Normally, the CPU firmware 24 performs predetermined processing. If an error occurs in this state during data transfer via the SCSI bus, a predetermined error correction program is executed. According to this program, the CPU firmware 24 examines the state of the THD terminal of the terminator 20. When temperature-dependent operation stoppage (thermal shutdown) is detected from the state of the THD terminal, the SPC 22 is put into an initiator mode wherein the fact that the terminator 20 is in a thermal shutdown state is notified to a host computer 26.

The host computer 26 recognizes that the terminator 20 is in shutdown and, for example, decreases the data transfer data bit rate. The data transfer rate by the SPC 22 is thereby modified so as to suppress errors to the minimum.

The SPC 22 and CPU firmware 24 may be considered as part of the host computer 26 that controls data transfer. In this case, the host computer 26 monitors the contents of the RS latch 12 in the terminator 20, and controls the transfer rate, etc.

In the drawings, the RS latch 12 and CPU firmware 24 are shown as being connected by special communication lines, however they are physically connected via the SPC 22 and SCSI bus. The CPU firmware 24 examines the electrical potential of the THD terminal of the RS latch 12.

According to this system, thermal shutdown of the terminator 20 can easily be recognized, and the reliability of the system can therefore be improved.

Figure 4:
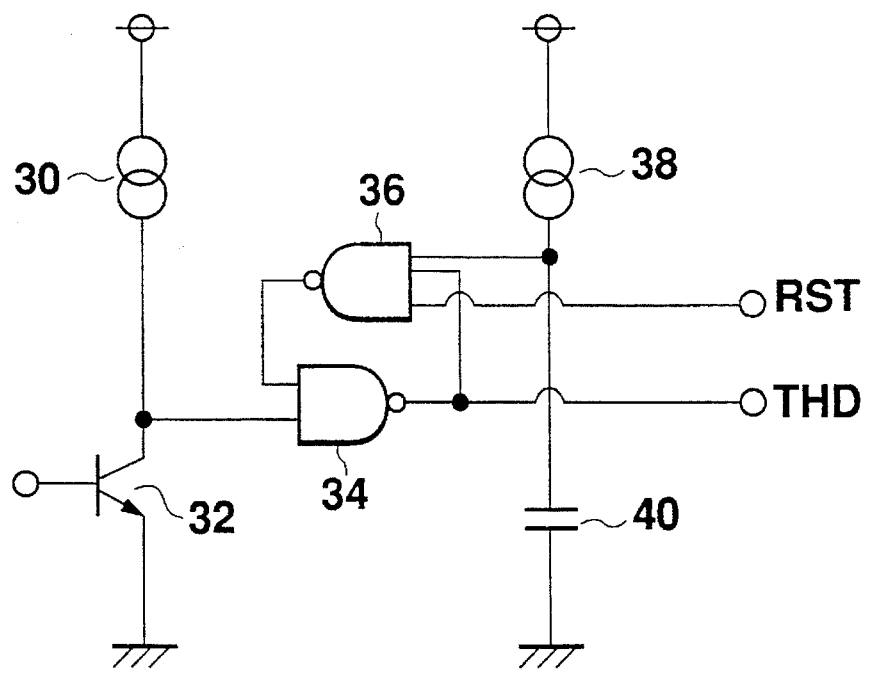
FIG. 4 is a diagram showing the construction of a latch circuit.

FIG. 4 shows one example of an RS latch circuit. An NPN transistor 32 that receives a thermal shutdown signal is installed on a base underneath the fixed current supply 30. The contact point of the power supply 30 and the transistor 32 is connected to one input terminal of a NAND gate 34. The output of this NAND gate 34 is connected to one input terminal of a NAND gate 36, and the output of the NAND gate 36 is connected to an input terminal of the NAND gate 34.

A condenser 40 is provided below the fixed current supply 38. The contact point of the fixed current supply 38 and condenser 40 is connected to an input terminal of the NAND gate 36. The other input terminal of the NAND gate 36 is connected to a terminal RST which receives the reset signal. The output of the NAND gate 34 is connected to the THD terminal that is the output of the latch circuit.

When this circuit begins operating, the fixed current supplies 30, 38 supply a predetermined fixed current. In the initial state, L is supplied to the base of the transistor 32 and the transistor 32 is off. H is then supplied to one input terminal of the NAND gate 34. As the condenser 40 is provided below the fixed current source 38, L is supplied to the NAND gate 36 when the condenser 40 is charging. When the voltage starts to rise, therefore, the output of the NAND gate 36 is H, and the output of the NAND gate 34. i.e. the THD terminal, is L. The input from the RST terminal is set so that it is constantly H, although L may also be supplied.

When the condenser 40 has finished charging, the input to one of the input terminals of the NAND gate 36 is H, but as the output of the NAND gate 34 is L, the output of the NAND gate 36 is still L.

Next, when a temperature rise of the terminator is detected, H is supplied to the base of the transistor 32. This switches the transistor 32 on, and both inputs of the NAND gate 34 go L. The output of the NAND gate 34 therefore goes H, and the output THD terminal goes H.

As all the inputs to the NAND gate 36 are then H, the output of the NAND gate 36 is L. This switches the transistor 32 off, so the output of the NAND gate 34 remains H even if one of the inputs to the NAND gate 34 goes H.

When the temperature of the terminator rises so that its operation stops, this state is latched by the latch circuit. Stoppage of operation due to thermal shutdown of the terminator can therefore be verified by observing the THD terminal from outside.

When the terminator has recovered, the RST terminal is set to L. The output of the NAND gate 36 therefore goes L, and as the transistor 32 is switched off, the output of the NAND gate 34 reverts to L.

The active terminator according to this invention can be used in various types of communication line, and is particularly suited to SCSI. It is therefore used in computer systems connected to peripheral devices such as magnetic media, e.g. CD-ROM, HD (Hard Disks) and TAPE (magnetic tape).

What is claimed:

1. An active terminator installed at the end of a communications bus, said terminator comprising:

a temperature detector for detecting temperature, a thermal shutdown circuit for stopping operation when the detected temperature reaches a predetermined temperature, and a memory for storing the operation stopping state caused by said thermal shutdown circuit.

2. An active terminator as defined in claim 1 wherein said memory is a latch circuit that can be set and reset.

3. An active terminator as defined in claim 2 further comprising a buffer amplifier that amplifies the output of said latch circuit, the output of said amplifier being connected to output terminals.

4. An active terminator as defined in claim 3 wherein said tempetature detector comprises a thermistor.

5. A system for performing communications using a communications bus comprising:

a protocol controller controlling for data transfer connected to one end of said communications bus, CPU firmware for performing data processing connected to said protocol controller, and an active terminator connected to the other end of said communications bus, and further comprising:

a temperature detector for detecting temperature, a thermal shutdown circuit for stopping operation when said detected temperature reaches a predetermined temperature, and a memory for storing said operation stop state caused by said thermal shutdown circuit.

6. A system as defined in claim 5 wherein said protocol controller modifies data transfer rate depending on the storage contents of said memory.

* * * * *